(12) United States Patent
Kooiman et al.

(10) Patent No.: US 11,966,167 B2
(45) Date of Patent: Apr. 23, 2024

(54) SYSTEMS AND METHODS FOR REDUCING RESIST MODEL PREDICTION ERRORS

(71) Applicant: ASML NETHERLANDS B.V., Veldhoven (NL)

(72) Inventors: Marleen Kooiman, Eindhoven (NL); David Marie Rio, Berchem-Sainte-Agathe (BE); Sander Frederik Wuister, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 396 days.

(21) Appl. No.: 16/771,343

(22) PCT Filed: Dec. 20, 2018

(86) PCT No.: PCT/EP2018/086415
§ 371 (c)(1),
(2) Date: Jun. 10, 2020

(87) PCT Pub. No.: WO2019/122250
PCT Pub. Date: Jun. 27, 2019

(65) Prior Publication Data
US 2020/0348598 A1    Nov. 5, 2020

Related U.S. Application Data

(60) Provisional application No. 62/769,283, filed on Nov. 19, 2018, provisional application No. 62/609,776, filed on Dec. 22, 2017.

(51) Int. Cl.
*G03F 7/00* (2006.01)
(52) U.S. Cl.
CPC .......... *G03F 7/705* (2013.01); *G03F 7/70666* (2013.01); *G03F 7/706839* (2023.05)

(58) Field of Classification Search
CPC ..... G03F 7/705; G03F 7/70091–70125; G03F 7/70141; G03F 7/70191; G03F 7/70425;
(Continued)

(56) References Cited

U.S. PATENT DOCUMENTS

| 6,869,739 | B1 | 3/2005 | Ausschnitt et al. |
| 7,587,704 | B2 | 9/2009 | Ye et al. |

(Continued)

FOREIGN PATENT DOCUMENTS

| CN | 103246173 | 8/2013 |
| JP | 2004140145 | 5/2004 |

(Continued)

OTHER PUBLICATIONS

International Search Report and Written Opinion issued in corresponding PCT Patent Application No. PCT/EP2018/086415, dated Apr. 8, 2019.

(Continued)

*Primary Examiner* — Christina A Riddle
(74) *Attorney, Agent, or Firm* — Pillsbury Winthrop Shaw Pittman LLP

(57) ABSTRACT

A method for calibrating a resist model. The method includes: generating a modeled resist contour of a resist structure based on a simulated aerial image of the resist structure and parameters of the resist model, and predicting a metrology contour of the resist structure from the modeled resist contour based on information of an actual resist structure obtained by a metrology device. The method includes adjusting one or more of the parameters of the resist model based on a comparison of the predicted metrology contour and an actual metrology contour of the actual resist structure obtained by the metrology device.

20 Claims, 20 Drawing Sheets

(58) Field of Classification Search
CPC ............. G03F 7/70433; G03F 7/70441; G03F 7/70483–70541; G03F 1/36; G03F 1/68–70; G03F 7/70605–706851
USPC ..... 355/18, 30, 52–55, 67–77; 430/5, 22, 30
See application file for complete search history.

(56) References Cited

U.S. PATENT DOCUMENTS

| | | | |
|---|---|---|---|
| 7,652,758 | B2 | 1/2010 | Park et al. |
| 7,703,069 | B1 | 4/2010 | Liu et al. |
| 8,200,468 | B2 | 6/2012 | Ye et al. |
| 8,458,626 | B1 | 6/2013 | Tirapu-Azpiroz et al. |
| 9,857,693 | B1 | 1/2018 | Liu et al. |
| 2005/0076322 | A1 | 4/2005 | Ye et al. |
| 2007/0031745 | A1* | 2/2007 | Ye ........................... G03F 7/705 430/30 |
| 2007/0032896 | A1 | 2/2007 | Ye et al. |
| 2007/0187595 | A1* | 8/2007 | Tanaka ............... G01N 23/2251 250/307 |
| 2008/0209386 | A1 | 8/2008 | Naka |
| 2009/0182448 | A1 | 7/2009 | Mansfield et al. |
| 2010/0119961 | A1 | 5/2010 | Ye et al. |
| 2010/0166289 | A1 | 7/2010 | Satake et al. |
| 2010/0171036 | A1 | 7/2010 | Abdo |
| 2011/0185324 | A1 | 7/2011 | Huang et al. |
| 2013/0204594 | A1 | 8/2013 | Liu |
| 2014/0121799 | A1* | 5/2014 | Liu ........................ G01B 15/00 700/97 |
| 2014/0123084 | A1 | 5/2014 | Tang et al. |
| 2017/0242344 | A1 | 8/2017 | Carcasi et al. |
| 2018/0082415 | A1 | 3/2018 | Sezginer et al. |
| 2018/0095358 | A1 | 4/2018 | Seitz et al. |

FOREIGN PATENT DOCUMENTS

| | | |
|---|---|---|
| KR | 1020080079623 | 9/2008 |
| WO | 2008022178 | 2/2008 |
| WO | 2017060192 | 4/2017 |

OTHER PUBLICATIONS

Chinese Office Action issued in corresponding Chinese Patent Application No. 201880082618.3, dated Jun. 15, 2022.

* cited by examiner

SYSTEMS AND METHODS FOR REDUCING RESIST MODEL PREDICTION ERRORS

CROSS-REFERENCE TO RELATED APPLICATIONS

This application is the U.S. national phase entry of PCT patent application No. PCT/EP2018/086415, which was filed on Dec. 20, 2018, which claims the benefit of priority of U.S. patent application Ser. No. 62/609,776 which was filed on Dec. 22, 2017, and of U.S. patent application Ser. No. 62/769,283 which was filed on Nov. 19, 2018, each of which is incorporated herein in its entirety by reference.

TECHNICAL FIELD

The description herein relates to systems and methods for improving predictions of resist contours made by resist models. Specifically, the description herein provides techniques of reducing resist model prediction errors.

BACKGROUND

A lithographic apparatus can be used, for example, in the manufacture of integrated circuits (ICs) or other devices. In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic apparatus will have a magnification factor M (generally <1), the speed F at which the substrate is moved will be a factor M times that at which the projection beam scans the patterning device.

Prior to the device fabrication procedure of transferring the pattern from the patterning device to the substrate of the device manufacturing process, the substrate may undergo various device fabrication procedures of the device manufacturing process, such as priming, resist coating and a soft bake. After pattern transfer, the substrate may be subjected to other device fabrication procedures of the device manufacturing process, such as a post-exposure bake (PEB), development, a hard bake and measurement/inspection of the transferred pattern. This array of device fabrication procedures is used as a basis to make an individual layer of a device, e.g., an IC. The substrate may then undergo various device fabrication procedures of the device manufacturing process such as etching, ion-implantation (doping), metallization, oxidation, chemo-mechanical polishing, metrology (e.g., using a scanning electronic microscope (SEM)), etc., all intended to finish off the individual layer of the device. If several layers are required in the device, then the whole process, or a variant thereof, is repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

So, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a pattern corresponding to a design layout onto a substrate using illumination from a deep-ultraviolet illumination source, creating individual functional elements having dimensions well below 100 nm, i.e. less than half the wavelength of the radiation from the illumination source (e.g., a 193 nm illumination source). This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or a pattern corresponding to a design layout. These include, for example, but not limited to, optimization of NA and/or optical coherence settings, customized illumination schemes, use of phase shifting patterning devices, optical proximity correction (OPC) in the pattern corresponding to the design layout (such as biasing of pattern feature, addition of an assist feature, applying a serif to a pattern feature, etc.), or other methods generally defined as "resolution enhancement techniques" (RET).

In lithographic applications, a resist model (e.g., Tachyon resist model) is frequently used to predict a resist contour of a profile as would be measured by a SEM apparatus. The resist model is introduced in order to correct for resist biases with respect to the resist contour predicted by a single aerial image. Specifically, either an aerial image at a suitable height within the resist thickness, or an average intensity of aerial images over the resist thickness is used for prediction purposes. Such a resist model is unable to accurately predict effects of focus dependent features, such as 1D line-space patterns in negative tone developed (NTD) resists with sub-resolution assist features (SRAFs) close to the main feature.

The inability of the currently used resist models to accurately predict effects of focus dependent features can be attributed to a feature dependent bias in a metrology measurement of the resist contour (e.g., a CDSEM measurement). It is anticipated that as feature sizes continue to shrink, the relative contribution of such biases introduced by the metrology devices will continue to grow, and thus introduce further modeling errors. Accordingly, there is a requirement of developing a system and method for reducing resist model prediction errors.

BRIEF SUMMARY

To enable understanding of how a patterning process works, computational lithography techniques can be used to simulate how one or more aspects of the patterning process "work." Thus, appropriate computational lithography software can predict one or more characteristics of the formation of a pattern on a substrate, such as a predicted CD, predicted contour, etc. of the pattern, and possibly do so at different stages of the formation of the pattern.

One aspect of such computational lithography is the prediction of the pattern in the resist layer. But, it has been discovered that existing techniques to predict the formation of the pattern in the resist layer may not adequately and/or quickly assess a pattern that can occur in the resist layer. Accordingly, it is desired, for example, to provide a technique that accurately and/or quickly predicts the expected (often highly complex) shapes of a resist pattern So, there is provided, for example, a method and system to improve resist model predictions of the resist layer. Specifically, the present disclosure describes a method for reducing resist modeling errors, for focus dependent features, by correcting for metrology device (e.g. SEM device) induced artifacts by utilizing information, for instance, from SEM measurements of the resist contour.

By one embodiment of the present disclosure, there is provided a method of calibrating a resist model. The method includes the steps of: generating a modeled resist contour of a resist structure based on a simulated aerial image of the resist structure and parameters of the resist model, predicting a metrology contour of the resist structure from the modeled resist contour based on information of an actual resist structure obtained by a metrology device, and adjusting the parameters of the resist model based on a comparison of the predicted metrology contour and an actual metrology contour of the actual resist structure obtained by the metrology device.

The information of the actual resist structure obtained by the metrology device corresponds to a width of a portion of a waveform generated by the metrology device.

The portion of the waveform corresponds to an edge of the actual resist structure imaged by the metrology device.

The predicted metrology contour of the resist structure is generated from the modeled resist contour based on parameters associated with the metrology device.

The method further includes the step of updating parameters of the metrology device based on a comparison of the predicted metrology contour and the actual metrology contour of the actual resist structure obtained by the metrology device.

The metrology device is a scanning electron microscope.

The method further includes the step of optimizing parameters of a mask layout and parameters of an optical source based on adjusted resist parameters of the resist model.

The method further includes the steps of: predicting, based on the adjusted parameters of the resist model, a metrology contour of another resist structure, obtaining by the metrology device, an actual metrology contour of the another resist structure, and computing an error based on a comparison of the predicted metrology contour of another resist structure and the actual metrology contour of another resist structure.

By one embodiment, there is provided a device for calibrating a resist model. The device includes a processor configured to generate a modeled resist contour of a resist structure based on a simulated aerial image of the resist structure and parameters of the resist model, predict a metrology contour of the resist structure from the modeled resist contour based on information of an actual resist structure obtained by a metrology device, and adjust the parameters of the resist model based on a comparison of the predicted metrology contour and an actual metrology contour of the actual resist structure obtained by the metrology device.

The information of the actual resist structure obtained by the metrology device corresponds to a width of a portion of a waveform generated by the metrology device.

The portion of the waveform corresponds to an edge of the actual resist structure imaged by the metrology device.

The width of the portion of the waveform is measured at a predetermined threshold intensity level.

The predicted metrology contour of the resist structure is generated from the modeled resist contour based on parameters associated with the metrology device.

The processor included in the device is further configured to update parameters of the metrology device based on a comparison of the predicted metrology contour and the actual metrology contour of the actual resist structure.

The metrology device is a scanning electron microscope.

The processor included in the device is further configured to optimize parameters of a mask layout and parameters of an optical source based on adjusted resist parameters of the resist model.

The processor included in the device is further configured to: predict based on the adjusted parameters of the resist model, a metrology contour of another resist structure, obtain by the metrology device, an actual metrology contour of the another resist structure, and compute an error based on a comparison of the predicted metrology contour of another resist structure and the actual metrology contour of another resist structure.

By one embodiment, there is provided a method including the steps of: generating a modeled resist contour of a resist structure based at least on a simulated aerial image of the resist structure, predicting, based on the modeled resist contour, the simulated aerial image, and at least one resist sidewall parameter of a set of resist sidewall parameters associated with the resist structure, a measurement of a portion of a waveform corresponding to an edge of an actual resist structure imaged by a metrology device, and adjusting the at least one resist sidewall parameter based on a comparison of the predicted measurement of the portion of the waveform and an actual measurement of the portion of the waveform corresponding to the edge of the actual resist structure imaged by the metrology device.

The predicted the predicted measurement of the portion of a waveform is a width of the portion of a waveform generated by the metrology device, the width being measured at a predetermined threshold intensity level.

The predicted measurement of the portion of the waveform generated by the metrology device is based on at least two resist sidewall parameters of the set of resist sidewall parameters.

The set of resist sidewall parameters includes three resist sidewall parameters, and the predicted measurement of the portion of the waveform generated by a metrology device is based on each resist sidewall parameter of the set of resist sidewall parameters.

The vertical intensity range parameter is computed as a difference between a first intensity of a first aerial image and a second intensity of a second aerial image, the first aerial image corresponding to a first location within a resist layer and the second aerial image corresponding to a second location within the resist layer.

The first location is in a top-third portion of the resist layer and the second location is in a bottom-third portion of the resist layer.

The first location is 15 nanometers below a top surface of the resist layer and the second location is 75 nanometers below the top surface of the resist layer.

The method further includes the step of optimizing parameters of a mask layout and parameters of an optical source based on the adjusted resist sidewall parameters.

The method further includes the steps of: predicting, based on a modeled resist contour of another resist structure, a simulated aerial image of another resist structure, and the adjusted at least one resist sidewall parameter of the set of resist sidewall parameters, another measurement of a portion of another waveform corresponding to an edge of another actual resist structure imaged by the metrology device, and determining an etch-quality of the edge of another actual resist structure based on the predicted measurement of the portion of another waveform.

In an embodiment, there is provided a non-transitory computer program product comprising machine-readable instructions for causing a processor to cause performance of a method as described herein. In an embodiment, there is provided a system, comprising a hardware processor; and a non-transitory computer program product as described herein.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
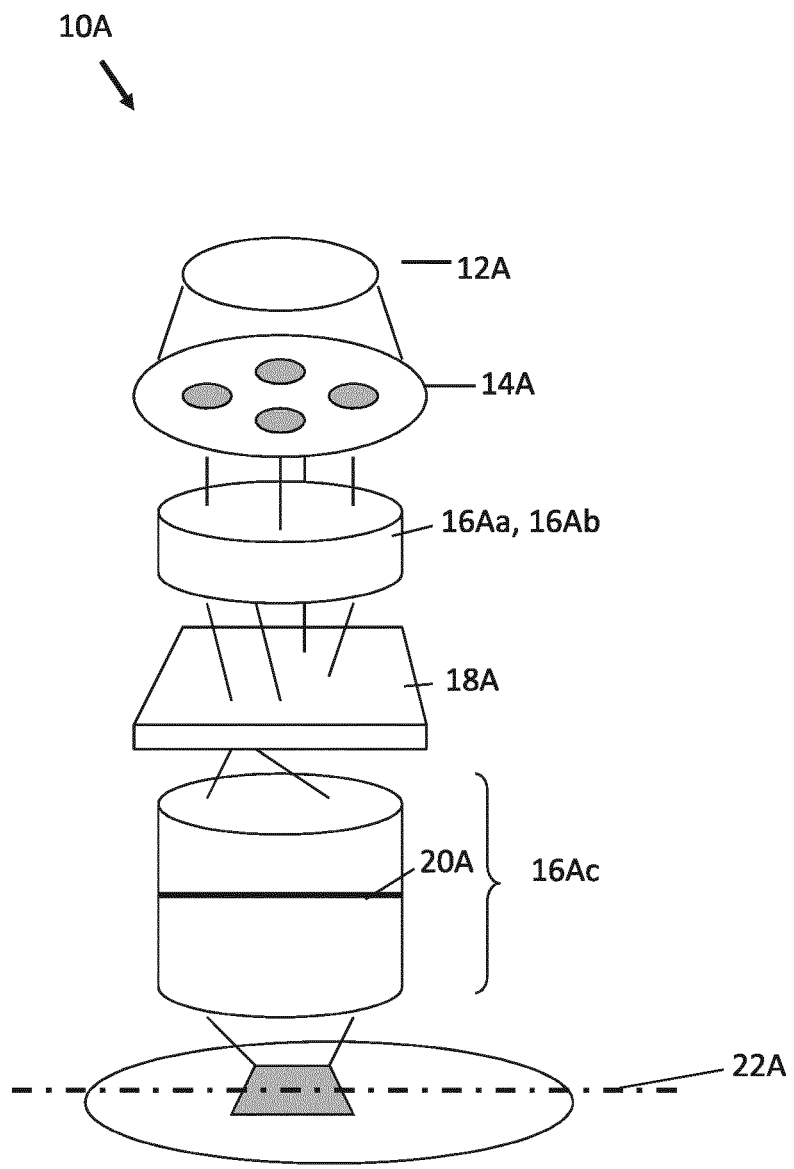
FIG. 1 is a block diagram of various subsystems of a lithography system.

As background to embodiments and turning to FIG. 1, there is illustrated an exemplary lithographic projection apparatus 10A. Major components are a radiation source 12A, which may be a deep-ultraviolet excimer laser source or other type of source including an extreme ultra violet (EUV) source, illumination optics which define the partial coherence (denoted as sigma) and which may include optics 14A, 16Aa and 16Ab that shape radiation from the source 12A; a support configured to hold a patterning device 18A; and projection optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$. In an embodiment, the lithographic projection apparatus itself need not have the radiation source 12A.

So, in a lithographic projection apparatus, the optics 16Ac directs an aerial image of the patterning device pattern onto the substrate (typically a de-magnified version). An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer.

Now, it is often desirable to be able to computationally determine how a patterning process would produce a desired pattern on a substrate. Thus, a simulation can be provided to simulate one or more parts of the process. For example, it is desirable to be able to simulate the lithography process of transferring the patterning device pattern onto a resist layer of a substrate as well as the yielded pattern in that resist layer after development of the resist.

Figure 2:
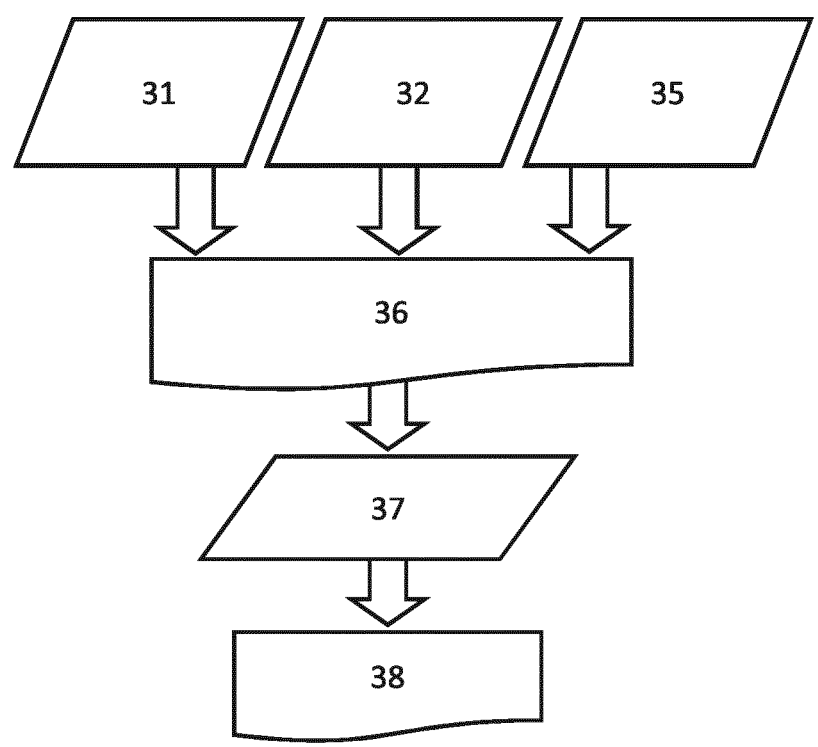
FIG. 2 is a block diagram of simulation models of a computational lithography technique.

An exemplary flow chart for simulating lithography in a lithographic projection apparatus is illustrated in FIG. 2. An illumination model 31 represents optical characteristics (including radiation intensity distribution and/or phase distribution) of the illumination. A projection optics model 32 represents optical characteristics (including changes to the radiation intensity distribution, polarization, and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated using the illumination model 31, the projection optics model 32 and the design layout model 35. A resist image 38 can be simulated from the aerial image 36 using a resist model 37. Simulation of lithography can, for example, predict contours and/or CDs in the resist image.

More specifically, it is noted that the illumination model 31 can represent the optical characteristics of the illumination that include, but not limited to, NA-sigma (σ) settings as well as any particular illumination shape (e.g. off-axis illumination such as annular, quadrupole, dipole, etc.). The projection optics model 32 can represent the optical characteristics of the of the projection optics, include, for example, aberration, distortion, a refractive index, a physical size or dimension, etc. The design layout model 35 can also represent one or more physical properties of a physical patterning device, as described, for example, in U.S. Pat. No. 7,587,704, which is incorporated by reference in its entirety. Optical properties associated with the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics, and hence design layout model 35.

The resist model 37 can be used to calculate the resist image from the aerial image, an example of which can be found in U.S. Pat. No. 8,200,468, which is hereby incorporated by reference in its entirety. The resist model is typically related primarily to properties of the resist layer (e.g., effects of chemical processes which occur during exposure, post-exposure bake and/or development), though because the resist model is typically calibrated on SEM measurement data, it will tend to incorporate SEM artifacts as well.

The objective of the simulation is to accurately predict, for example, edge placements, aerial image intensity slopes and/or CDs, which can then be compared against an intended design. The intended design is generally defined as a pre-OPC design layout which can be provided in a standardized digital file format such as GDSII, OASIS or other file format.

From the design layout, one or more portions may be identified, which are referred to as clips. In an embodiment, a set of clips is extracted, which represents the complicated patterns in the design layout (typically about 50 to 1000 clips, although any number of clips may be used). As will be appreciated by those skilled in the art, these patterns or clips represent small portions (e.g., circuits, cells, etc.) of the design and more particularly, the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips often contain one or more test patterns or gauge patterns. An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In some examples, the simulation and modeling can be used to configure one or more features of the patterning device pattern (e.g., performing optical proximity correction), one or more features of the illumination (e.g., changing one or more characteristics of a spatial/angular intensity distribution of the illumination, such as change a shape), and/or one or more features of the projection optics (e.g., numerical aperture, etc.). Such configuration can be generally referred to as, respectively, mask optimization, source optimization and projection optimization. Such optimizations can be performed on their own or combined in different combinations. One such example is source-mask optimization (SMO), which involves the configuring of one or more features of the patterning device pattern together with one or more features of the illumination. The optimization techniques may focus on one or more of the clips. The optimizations may use the simulations described herein to produce values of various parameters.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules and the evaluation points can include physical points on a resist image on a substrate, as well as non-physical characteristics such as dose and focus.

As noted above, a layer on a substrate can have a pattern transferred thereto. Such a layer will be generally referred to as a resist layer and may have various chemical compositions. In an embodiment, the resist layer is a layer of radiation-sensitive material. The resist layer usually has a small but finite thickness that may be comparable in size to patterns imaged onto the resist. The resist layer may undergo various treatments in a lithographic process. For example, the resist may be exposed to radiation such as EUV or DUV, which induces chemical reactions in the resist. The resist may undergo a post-exposure bake (PEB), development (e.g., positive tone development or negative tone development), and/or a hard bake. Each of these treatments may cause the resist to deform in one, two or three dimensions and the deformation may be location dependent (e.g., three-dimensional location dependent). The deformation of the resist may affect downstream treatments such as material deposition and etching. In a lithographic process using negative tone development, the impact of the resist deformation on resist top loss and critical dimension may be especially significant. Therefore, a resist model 37 with the ability to predict deformation of the resist is beneficial to more accurate lithography and higher yield. The resist model 37 may also be able to predict the reaction of the resist layer to various other physical and chemical treatments in the lithographic process. An exemplary resist model according to an aspect of the present disclosure is described later.

FIG. 3A, FIG. 3B, FIG. 3C and FIG. 3D schematically show exemplary deformation of a resist layer 310 on a substrate 320. A pattern is formed in the resist layer, e.g., by exposing the resist layer 310 to radiation 330 via a patterning device 340. The resist layer 310 may undergo post-exposure treatments such as PEB and deform into a deformed resist layer 350. In this example, the deformation of the resist layer 310 is such that the portion of the deformed resist layer 350 exposed to the radiation has a smaller thickness than the rest of the deformed resist layer 350. A portion 355 of the deformed resist layer 350 received sufficiently high dose during the exposure to remain on the substrate 320 after negative tone development and the rest (e.g., portions 356) of the deformed resist layer 350 is dissolved after negative tone development. Alternatively, the portion 355 of the deformed resist layer 350 received sufficiently high dose during the exposure to dissolve during positive tone development and the rest of the deformed resist layer 350 remains on the substrate 320 after positive tone development. Whether the portion 355 remains or dissolves depends on the chemical composition of the resist and the chemical composition of the developer.

Figure 3A:
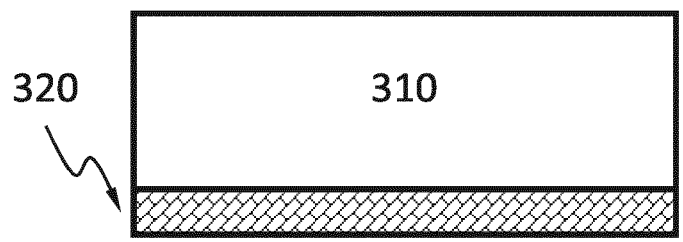
FIG. 3A, FIG. 3B, FIG. 3C and FIG. 3D schematically show exemplary deformation of a resist layer on a substrate.
Figure 3B:
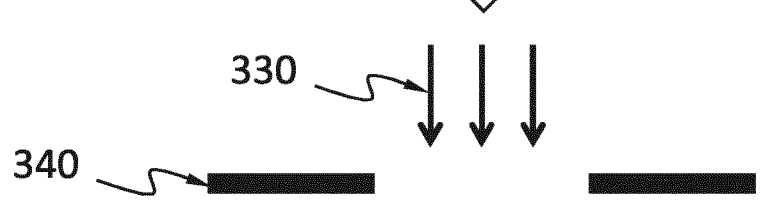
Figure 3B:
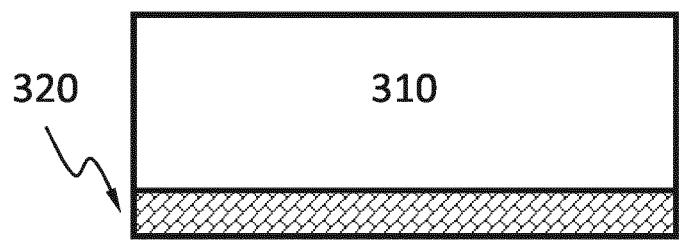
Figure 3C:
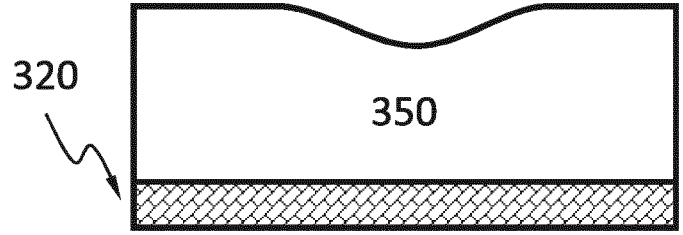
Figure 3D:
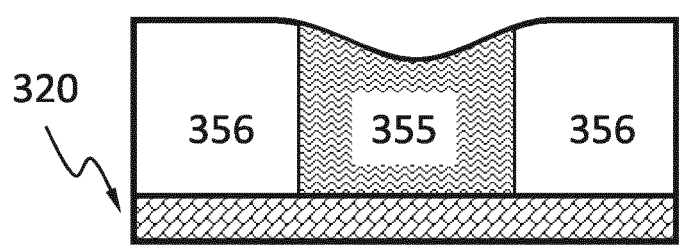
Figure 4A:
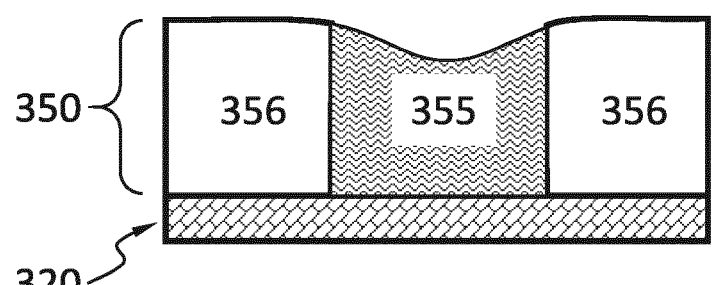
FIG. 4A, FIG. 4B, FIG. 4C and FIG. 4D schematically show exemplary additional deformation caused by development of the resist layer.
Figure 4B:
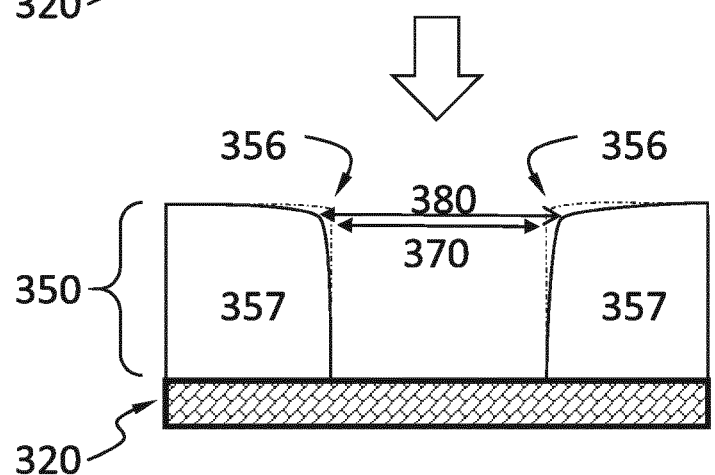
Figures 4C, 4D:
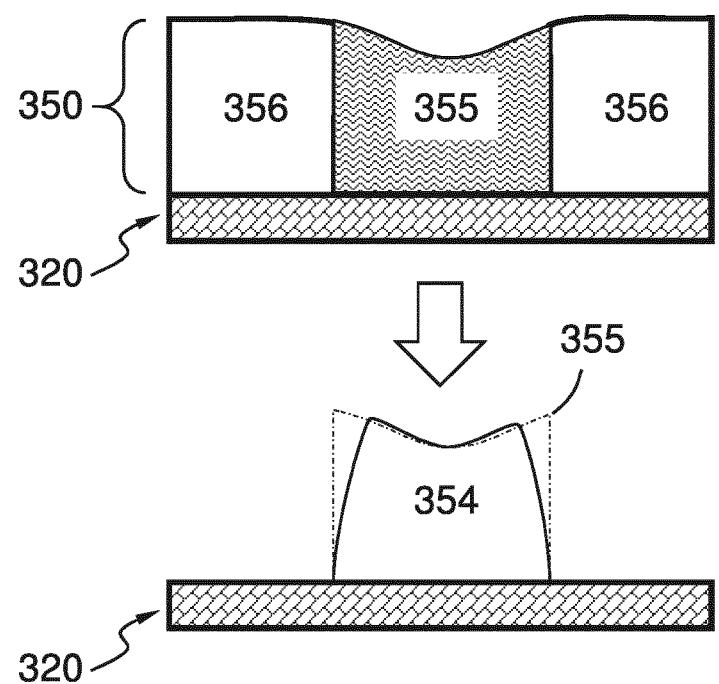

Portions of the resist layer soluble to a developer are removed during development. The removal of these portions may cause deformation in the remaining portions of the resist layer that is in addition to or alternative to deformation in the resist layer 350 as described with respect to FIG. 3. FIG. 4A, FIG. 4B, FIG. 4C and FIG. 4D schematically show such exemplary additional deformation. FIG. 4A shows the exposed resist layer 350 of FIG. 3 (with the optional deformation shown in FIG. 3C) with the portion 355 that received sufficiently high dose during the exposure and thus is soluble to a positive tone developer and portions 356 that did not receive sufficiently high dose and thus is insoluble to the positive tone developer. FIG. 3B shows that, during development, the portion 355 is dissolved and the portions 356 remain. As part of such development or during a period thereafter, portions 356 can deform into portions 357. This can occur during the removal of the portion 355 and/or for a period after development is completed. The dotted lines represent the contour of the portions 356. In the example, the portions 356 contract and become the portions 357. FIG. 4C shows the exposed resist layer 350 of FIG. 3 (with the optional deformation shown in FIG. 3C) with the portion 355 that received sufficiently high dose during the exposure and thus is insoluble to a negative tone developer and portions 356 that did not receive sufficiently high dose and thus is soluble to the negative tone developer. FIG. 4D shows that, during development, the portion 355 remains and the portions 356 are dissolved. As part of such development or during a period thereafter, portion 355 can deform into portion 354. This can occur during the removal of the portions 356 and/or for a period after development is completed. The dotted lines represent the contour of the portion 355. In the example, the portion 355 contracts and becomes the portion 354.

By one embodiment of the present disclosure, there is provided a method to reduce resist model errors in predicting the contour of the resist layer. The method accurately predicts the resist contours, especially for focus dependent features by correcting for SEM (i.e., metrology device) induced artifacts. Specifically, the method utilizes information from a SEM waveform to correct for SEM induced artifacts. By one embodiment, the information from the SEM waveform corresponds to a width of a white-band in the SEM waveform that corresponds to the resist contour. Details regarding the SEM waveform are described next with references to FIGS. 5A and 5B.

By one embodiment, the motivation for correcting for SEM-induced artifacts by using the width of the white-band in the CDSEM image is that the width of the white-band is a measure for the side wall shape of the resist. The side wall shape of the resist is determined by three parameters: a slope of the Aerial Image, a Vertical intensity range parameter, and line CD. Moreover, the width of the white band correlates with resist model errors, which by one embodiment of the present disclosure is attributed to a shape-induced bias in the CDSEM measurement. It must be appreciated that the bias in the CDSEM measurement is currently not modeled in resist models such as the Tachyon resist model. Accordingly, in what follows, the width of the white-band is utilized in the calibration process of the resist model. Moreover, as described below, the calibrated resist model can be utilized for verification purposes as well as in source-mask optimization applications.

Figure 5A:
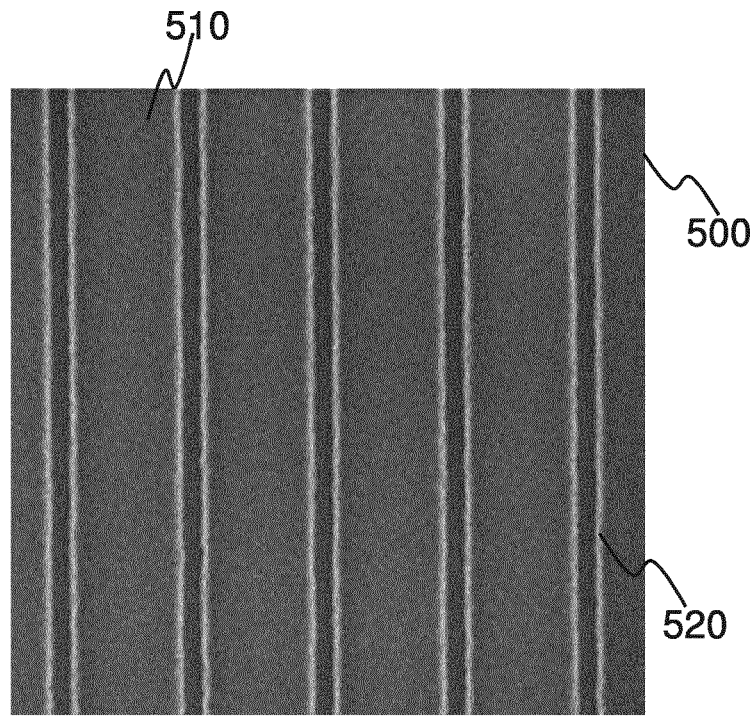
FIG. 5A depicts an exemplary SEM image.

Turning now to FIG. 5A, there is depicted an exemplary SEM image 500. The SEM image includes a plurality of resist contours (e.g., 1D line features) as denoted by 510. Each line feature includes a white-band 520 at either side of the line feature. It must be appreciated that due to artifacts in the current Scanning Electron Microscopes, there is a difference in width and brightness of the white-band at the left and right side of the line feature. Accordingly, by one embodiment, only the measured width of the white-band at one side (e.g., left side or right side) of the feature is utilized in the calibration process of the resist model.

As will be appreciated, the full contour need not be used in performing the methods described herein. For example, a size of the contour could be used. If the contour is a circle, for example, the size of the circle could be used as a parameterization of the contour. In one approach, the size can be the width in one direction (x or y, for example). In general, any type of parameterization of the contours may be used in place of the contour itself.

As an example, an elongated feature may be fit to an ellipse, and the parameterization may be the long or the short axis. In a typical pattern, the features are printed along the x or the y direction, such that the long and short axes of an ellipse fit to the feature would likewise be in the x or y direction.

More generally still, a contour may be fit to a predefined shape (circle, ellipse, straight line, line with rounded caps), and from that, parameters are determined, axes of the ellipse, width (CD) of the line, distance between one feature and the other (tip2tip), for example.

Figure 5B:
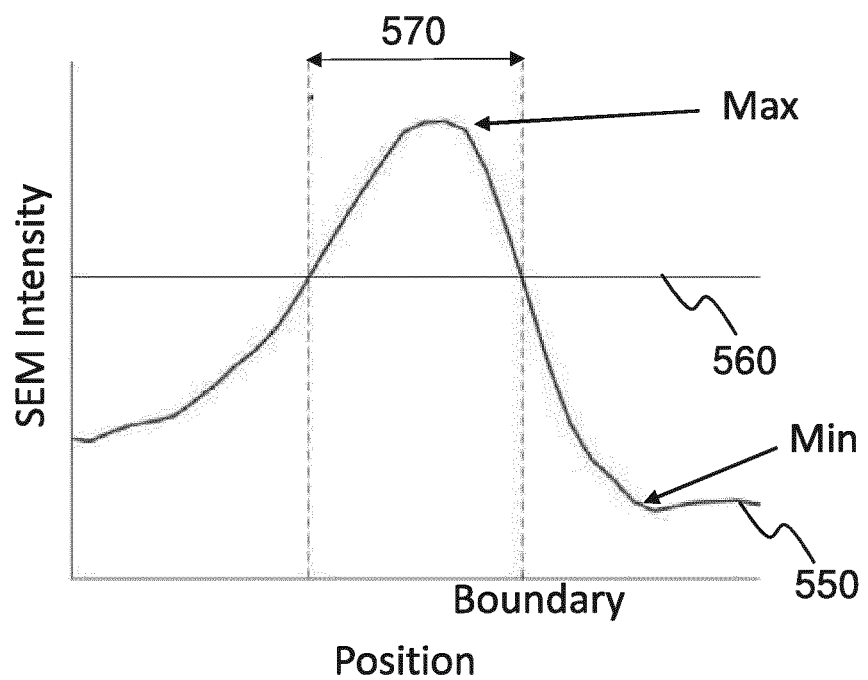
FIG. 5B depicts an exemplary SEM waveform corresponding to a portion of the SEM image.

FIG. 5B depicts an exemplary SEM waveform 550 corresponding to a region of the SEM image. Specifically, the SEM waveform 550 in FIG. 5B corresponds to the white-band region 520 as depicted in FIG. 5A. Referring to FIG. 5B, the width 570 of the white-band of the SEM waveform is measured with respect to a predetermined threshold intensity level 560.

In an embodiment, the threshold is based on the minimum and maximum of a filtered SEM signal as shown in FIG. 5B. Typically, the threshold may be set at around 60% of the difference between the minimum and maximum, though in principle other percentages may be used.

In an embodiment, the minimum and maximum are locally measured, near to the white band of interest, rather than a minimum and maximum for the full image, because of SEM artifacts or other sources of local extrema that are not representative of the features of interest.

Typical resist models (e.g. Tachyon resist model) include either averaging the aerial images over the resist thickness, or selecting an aerial image at a suitable height within the resist layer. Such an approach leads to an inaccurate prediction of focus dependent features, such as 1D line-space patterns in negative tone developed (NTD) resists with sub-resolution assist features (SRAFs) close to the main feature. Accordingly, by one embodiment of the present disclosure, a parameter referred to herein as vertical intensity range (VIR) parameter at the feature edge is used as a measure of change in aerial image intensity through the resist thickness. Specifically, the parameter VIR is defined as follows:

$$VIR(x,y) = AI(x,y,AI_{location}=15 \text{ nm}) - AI(x,y,AI_{location}=75 \text{ nm}) \quad (1)$$

wherein, x and y correspond to the coordinates within a layer of the resist and $AI_{location}$ corresponds to a depth within the resist thickness. Note that the depth can be measured with respect to a top surface of the resist layer.

Figure 6A:
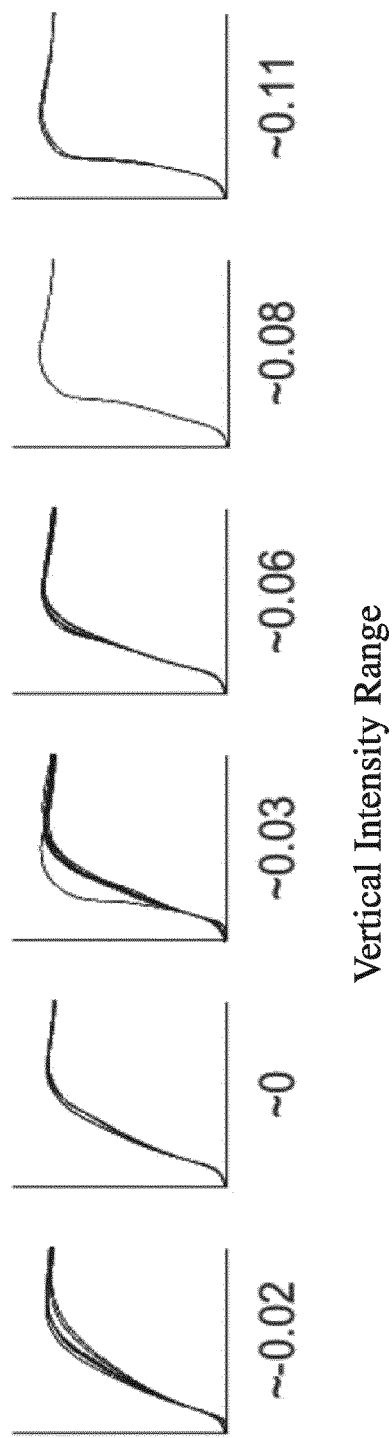
FIG. 6A illustrates exemplary graphs depicting effect of vertical intensity range on shape of a resist layer.
Figure 6B:
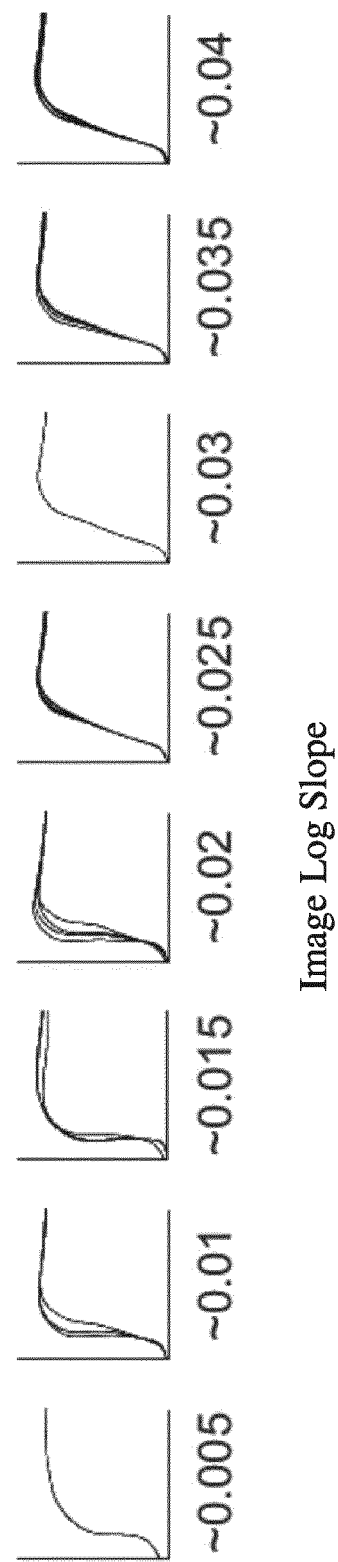
FIG. 6B illustrates exemplary graphs depicting effect of image log slope on shape of a resist layer.

By one embodiment, a slope of the aerial image and the VIR affect the shape of the resist. The slope of the aerial image intensity as a function of position measures a steepness of the image in transitioning from bright to dark. A normalized slope (referred to herein as an image log slope (ILS)) of the aerial image is obtained by dividing the slope by the intensity of the image. FIG. 6A illustrates exemplary graphs depicting the effects of vertical intensity range of feature shape for features having similar image log slope. Specifically, FIG. 6A depicts how a profile of a sidewall of the resist layer changes with varying VIR. It can be observed that an increase in VIR results in a reduction of the side wall of the resist layer. In a similar manner, FIG. 6B illustrates exemplary graphs depicting the effect of image log slope on the feature shape for features having similar VIR. FIG. 6B depicts that an increase in ILS results in an increase in the side wall of the resist layer.

Figure 7A:
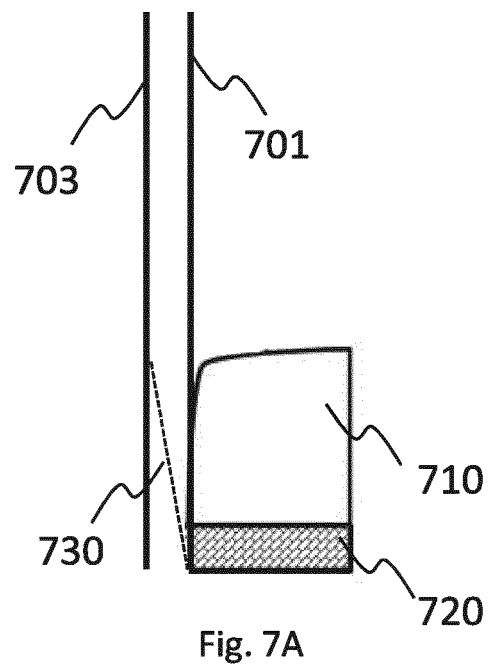
FIGS. 7A and 7B depict according to an embodiment, a schematic illustrating effect of the vertical intensity range on resist shape.
Figure 7B:
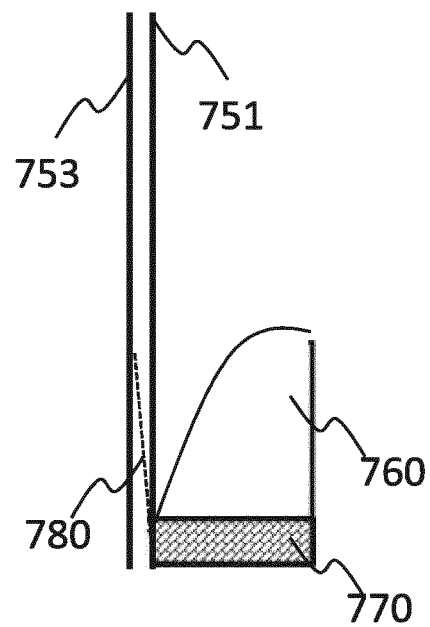

Turning to FIGS. 7A and 7B, there is depicted according to an embodiment, schematics illustrating the effect of the vertical intensity range on a feature shape. FIG. 7A depicts a scenario of having a large positive VIR between a top surface and a bottom surface of the resist thickness. Lines 701 and 703 correspond respectively, to points with the same aerial image intensity at the bottom of the resist layer and at the top of the resist layer. It must be appreciated that when the VIR has a large positive value, (i.e., difference between aerial image intensities between the top layer and bottom layer of the resist is large), an iso-intensity curve 730 is substantially overhanging. This results in a vertical resist shape 710 formed on a substrate 720.

In contrast, FIG. 7B depicts a scenario of having a small positive VIR between the top surface and the bottom surface of the resist thickness. Lines 751 and 753 correspond to points with the same aerial image intensity at the bottom of the resist layer and at the top of the resist layer, respectively. When the VIR between the top surface and the bottom surface of the resist thickness is small (i.e., difference between aerial image intensities between the top layer and bottom layer of the resist is small), the iso-intensity curve 780 is substantially vertical. In such a case, the resist 760 that is formed on the substrate 770 has a significant side wall.

Figure 8A:
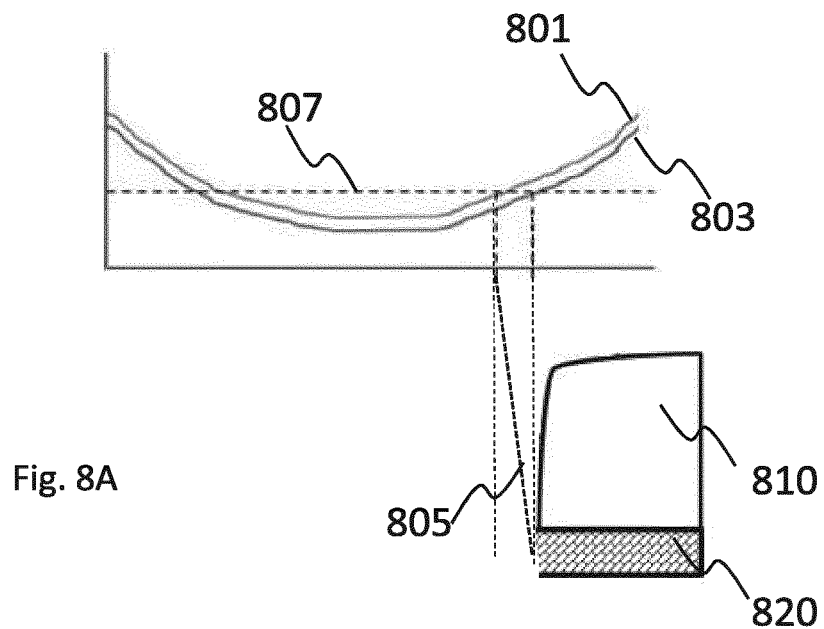
FIGS. 8A and 8B depict according to an embodiment, a schematic illustrating effect of the image log slopes on resist shape.
Figure 8B:
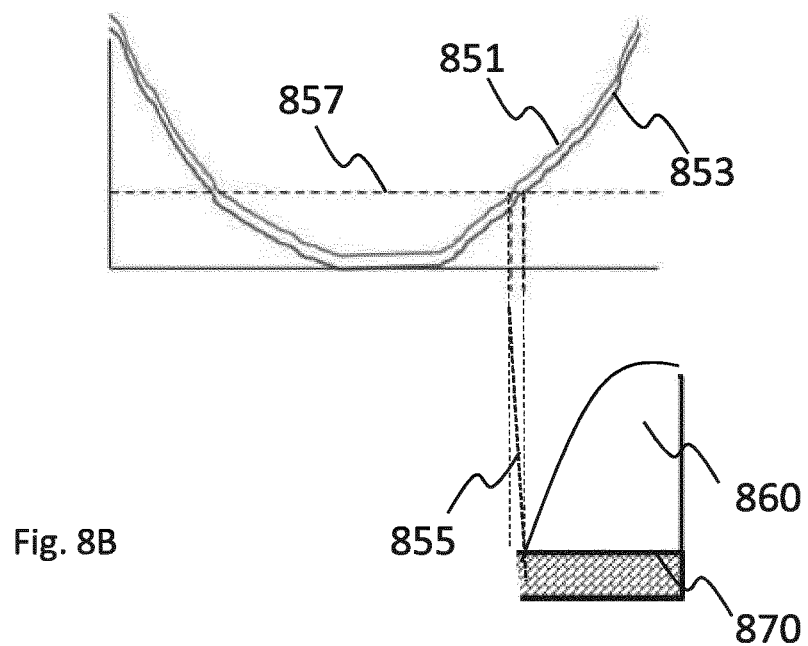

Turning now to FIGS. 8A and 8B, there is depicted according to an embodiment, schematics illustrating the effect of image log slope (ILS) on the resist shape. It must be appreciated that as light is absorbed by the resist, the intensity at the top of the resist is always slightly higher than at the bottom.

FIG. 8A depicts a scenario of having a small ILS between a top surface and a bottom surface of the resist thickness. Curves 801 and 803 correspond respectively, to points with the same aerial image intensity at the bottom of the resist layer and at the top of the resist layer. It must be appreciated that when the ILS is small, a horizontal distance between points having the same intensity on the top and bottom layers of the resist is large. Specifically, considering a particular intensity level denoted by line 807, one can note that the horizontal distance between points that lie on the curves 801 (or 803) and that intersect the line 807 is large. In the case of having a small ILS, an iso-intensity curve 805 is substantially overhanging. This results in a vertical resist shape 810 formed on a substrate 820.

In contrast, FIG. 8B depicts a scenario of having a large ILS between a top surface and a bottom surface of the resist thickness. Curves 851 and 853 correspond respectively, to points with the same aerial image intensity at the bottom of the resist layer and at the top of the resist layer. It must be appreciated that when the ILS is large, a horizontal distance between points having the same intensity on the top and bottom layers of the resist is small. Specifically, considering a particular intensity level denoted by line 857, one can note that the horizontal distance between points that lie on the curves 851 (or 853) and that intersect the line 857 is small. In such a case of having a large ILS, an iso-intensity curve 855 is substantially vertical. In this case, the resist 860 that is formed on the substrate 870 has a significant side wall.

As stated previously, the width of the white-band (obtained via the SEM image) is a measure for the side wall shape of the resist. The side wall shape of the resist is determined by three parameters: the slope of the Aerial Image, a Vertical intensity range parameter of the resist, and line CD (critical dimension).

The VIR parameter is computed as a difference between a first intensity of a first aerial image at a first location within the resist, and a second intensity of a second aerial image at a second location within the resist layer. By one embodiment, the first location is 15 nm beneath the top surface of the resist layer, and the second location is 75 nm beneath the top surface of the resist layer. However, it must be appreciated that the above values of 15 nm and 75 nm are in no way limiting the scope of the present disclosure. For instance, the first location may be selected from a top-third portion of the resist layer and the second location may be selected from a bottom-third portion of the resist layer.

Additionally, by one embodiment of the present disclosure, the first location can be a location corresponding to a first average intensity of aerial images computed in a first portion of the resist layer, and the second location can be a location corresponding to a second average intensity of aerial images computed in a second portion of the resist layer. The first portion can be a top portion of the resist layer having a first height, and the second portion is a bottom portion of the resist layer having a second height, wherein the first height is 20% of a height of the resist layer, and the second height is 20% of the height of the resist layer. Alternatively, the first height can be 30% of a height of the resist layer, and the second height can be 30% of the height of the resist layer.

Furthermore, by one embodiment, the width of the white-band of the SEM image is dependent on the line CD, the VIR parameter, and the slope of the aerial image. Specifically, by one embodiment, the width of the white-band increases with increasing line CD and decreases with increasing slope of the aerial image. Moreover, the width of the white-band of the SEM image decreases with increasing VIR values. Thus, the width of the white-band is affected by the same parameters that also determine the side wall shape, namely the line CD, slope of the Aerial Image, and the VIR parameter. Thus, by one embodiment, the width of the white-band of the SEM image is a measure of the side wall shape of the resist. Accordingly, as described below, the width of the white-band of the SEM image is utilized to correct for SEM induced artifacts in the resist model predictions of resist contours.

Figure 9:
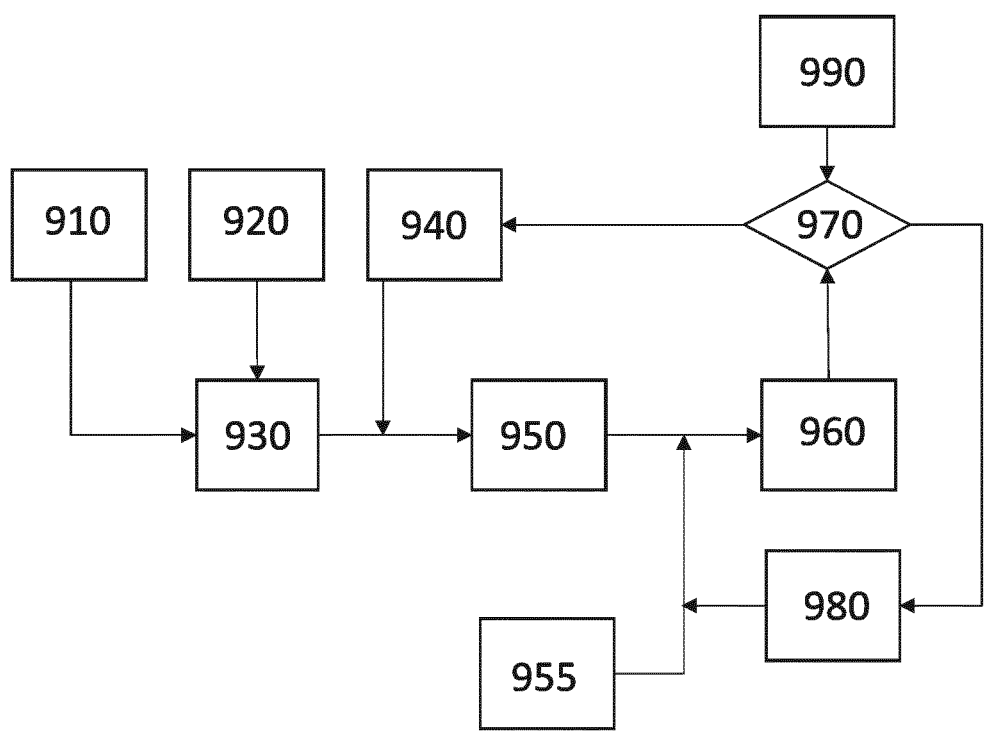
FIG. 9 depicts an exemplary flowchart illustrating steps performed in calibrating a resist model according to one embodiment of the present disclosure.

Turning now to FIG. 9, there is provided an exemplary flowchart illustrating steps performed in calibrating a resist model according to an embodiment of the present disclosure.

The calibration of the resist model (e.g., Tachyon resist model) commences by obtaining a mask (step 910), and an illumination optical system model (step 920) to generate a simulated aerial image (step 930) of the resist layer.

Further, initial values of a set of resist parameters of the resist model under consideration are determined in step 940. A resist contour of the resist structure is generated (i.e., predicted) in step 950 based on the resist parameters determined in step 940, and the simulated aerial image generated in step 930.

Further, the calibration process obtains information of an actual resist structure acquired by a metrology device (e.g., a SEM device) in step 955. For instance, by one embodiment, a measurement of a width of a white-band as acquired by CDSEM is obtained in step 955. Based on the measured width of the white-band as acquired by the CDSEM, the predicted resist contour of step 950, and initial values of the SEM bias parameters (that characterize the SEM device) from step 980, the calibration process predicts a SEM contour of the resist structure in step 960. By one embodiment, the bias associated with the SEM device can be represented as:

$$\text{SEM bias} = c_0 + -cW_{white\ band} \times W_{white\ band} \quad (2)$$

where $c_0$ and $cW_{white\ band}$ are the effective SEM parameters. The process then proceeds to step 970, wherein a query is performed to determine whether the predicted SEM contour of step 960 matches to an actual SEM contour as measured by the CDSEM (step 990). Based on a degree of match between the predicted SEM contour and the actual SEM contour, the calibration process provides a feedback to step 940 and 980 respectively. Specifically, the feedback loop corresponds to a step of parameter calibration, wherein the resist parameters are updated in step 940, and the effective SEM parameters are updated in step 980, respectively.

Further, the calibration process as outlined in FIG. 9 repeats the steps of 940, 950, 980, 960, and 970 until a stopping criterion is satisfied. By one embodiment, the stopping criteria may correspond to having an exact match between the predicted SEM contour and the actual SEM contour. Alternatively, by one embodiment, the stopping criterion may correspond to an error in the match between the predicted SEM contour and the actual SEM contour being within a predetermined or selected threshold level. In an embodiment, the calibration may be performed using a set of preset combinations of resist parameters. The model is evaluated on every point on the grid of parameters, and the result with the minimum error is selected. In this case, there is not a "stopping criterion" per se, but rather instead a selection from among the various choices.

Note that upon satisfying the stopping criterion, the resist parameters of the resist model are calibrated in a manner such that the resist model is substantially independent of the SEM settings. That is, recognizing that perfect calibration may not be practically achievable, ideally repeating the experiment with a different SEM voltage should change only the parameters of the model 980. Accordingly, embodiments may provide an ability to use multiple SEM measurements at different processing conditions, which may provide an extra calibration option for the resist model. In this regard, the resist parameters may further incorporate the VIR parameter as discussed above.

Figure 10:
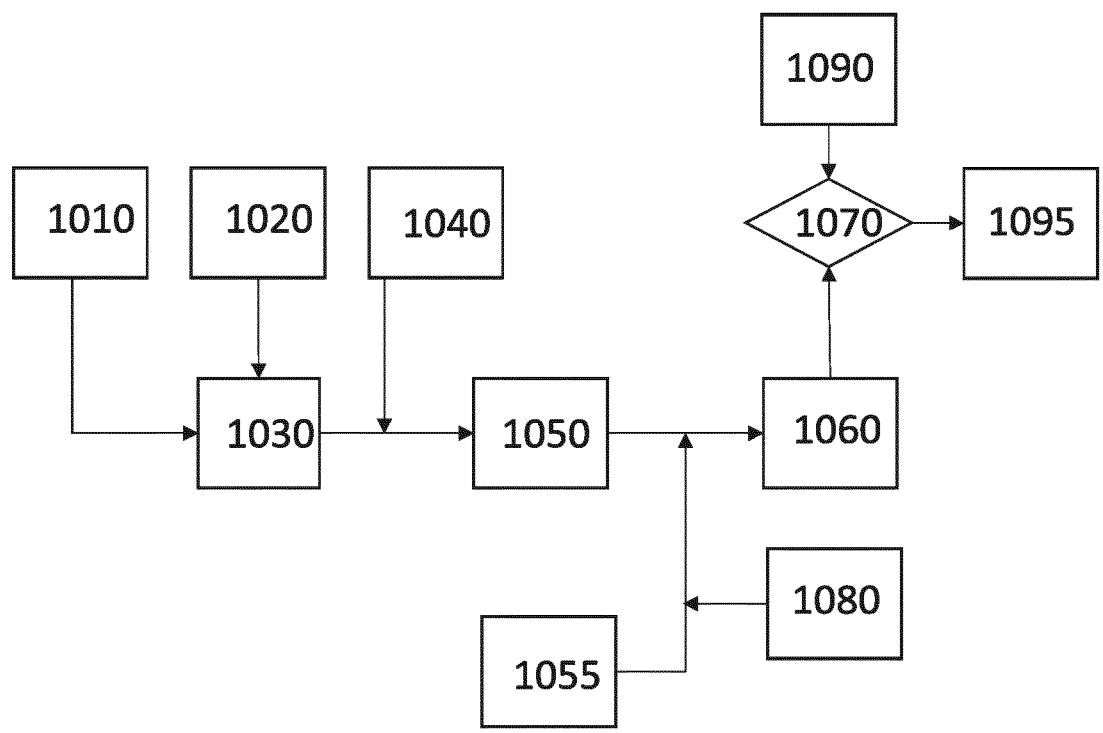
FIG. 10 depicts an exemplary flowchart illustrating steps performed to verify the calibrated resist model according to an embodiment of the present disclosure.

FIG. 10 depicts an exemplary flowchart illustrating steps performed to verify the calibrated resist model according to an embodiment of the present disclosure.

The process to verify the calibrated resist model commences by obtaining a mask (step 1010), and an illumination optic system (step 1020) to generate a simulated aerial image (step 1030) of another resist structure.

Further, calibrated values of the resist parameters of the resist model (step 1040) and the simulated aerial image generated in step 1030 are utilized to predict a resist contour of the another resist structure under consideration in step 1050.

Moreover, the verification process obtains information of an actual resist structure acquired by a metrology device (e.g., a SEM device) in step 1055. For instance, as stated previously, by one embodiment, a measurement of a width of a white-band as acquired by CDSEM can be obtained in step 1055. Based on the measured width of the white-band as acquired by the CDSEM, the predicted resist contour of step 1050, and calibrated values of the SEM bias parameters (step 1080), the verification process predicts a SEM contour of the resist structure in step 1060.

The verification process further proceeds to step 1070, wherein a query is performed to determine whether the predicted SEM contour of step 1060 matches an actual SEM contour (of the resist structure under consideration) as measured by the CDSEM (step 1090). The process further proceeds to step 1095, wherein a root mean square error can be computed between the predicted SEM contour and the actual SEM contour to determine validity of the calibrated model. It must be appreciated that a low value of the root-mean-square error computed in step 1095 corresponds to an accurately calibrated resist model.

Figure 11:
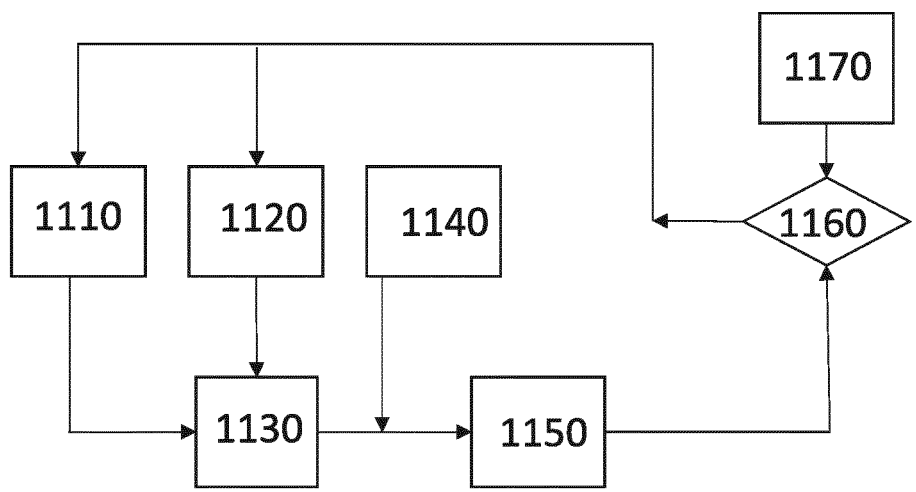
FIG. 11 depicts an exemplary flowchart illustrating steps performed in a source mask optimization process according to an embodiment of the present disclosure.

FIG. 11 depicts an exemplary flowchart illustrating steps performed in a source mask optimization (SMO) process according to an embodiment of the present disclosure.

The SMO optimization process commences by determining initial parameter values for mask layout pattern (step 1110) and optical illumination system parameters (step 1120). By one embodiment, the initial parameters of the optical illumination system include tuning and adjustment parameters such as an outer radius of the circular illumination region, inner radius of an annular region, a pole angle that defines an angle that is subtended by each pole in the inner and outer radii, and the like, whereas mask layout pattern parameters may correspond to tuning and adjustment parameters related to a phase shift mask or a binary mask.

In step 1130, an aerial image is generated based on the initial parameters of the mask layout pattern and the optical illumination system. Further, the optimization process predicts a resist contour in step 1150 based on the generated aerial image (step 1130) and resist parameters of a resist model (step 1140). It must be appreciated that the resist model under consideration in the SMO process can be initially calibrated by the calibration process as outlined in FIG. 9.

Further, the process proceeds to step 1160, wherein a query is performed to determine whether the predicted resist contour of step 1150 matches an actual contour designed for instance by a chip designer (step 1170).

By one embodiment, based on a degree of match between the predicted resist contour of step 1150 and the actual contour, the SMO process provides a feedback to steps 1110 and 1120, respectively. Specifically, the feedback loops correspond to a step of parameter calibration of the mask layout parameters and the optical illumination system parameters.

It must be appreciated that the SMO process as outlined in FIG. 11 repeats the steps of calibrating (i.e., updating the parameters of the mask layout and the optical illumination system) until a stopping criterion is satisfied. By one embodiment, the stopping criteria may correspond to having an exact match between the predicted resist contour and the actual contour as designed by the chip designer. Alternatively, by one embodiment, the stopping criterion may correspond to an error in the match between predicted resist contour and the actual contour being within a predetermined threshold level. Additionally, the SMO process may continue to calibrate the parameters of the mask layout and/or the parameters of the optical illumination system until an optimization objective (e.g., a cost function) associated with the SMO is achieved. It must be appreciated that the SMO process as outlined in FIG. 11 is different from typical source-mask optimization applications in that the SMO of FIG. 11 attempts at matching a desired contour to a predicted resist contour that does not include SEM artifacts. Note that the predicted resist contour does not include SEM induced artifacts, as the resist parameters that are utilized to predict the resist contour are calibrated in a manner that incorporates SEM biases. Specifically, the resist parameters are calibrated by the calibration process as outlined in FIG. 9.

Figure 12:
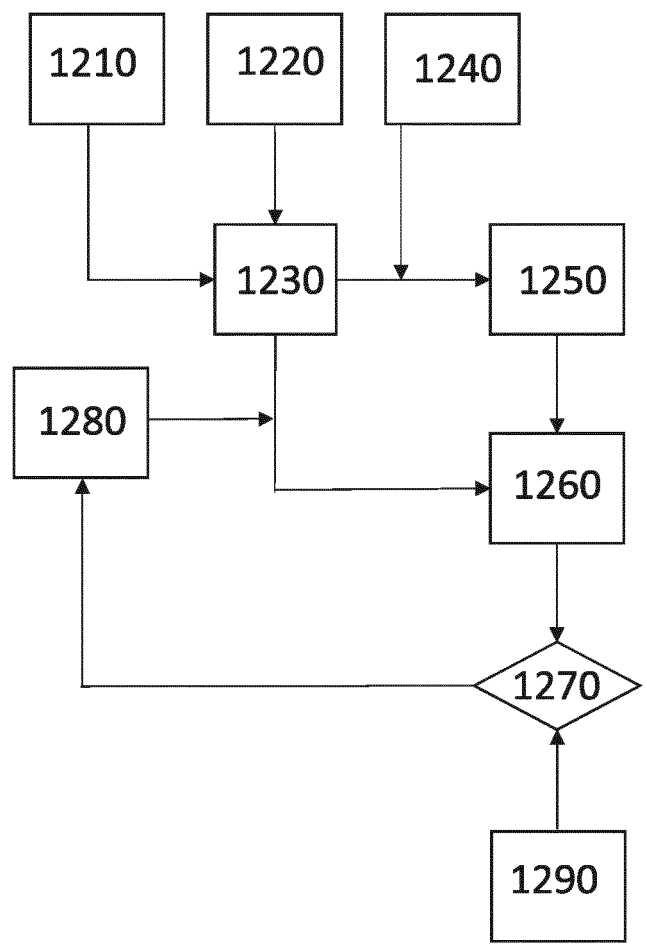
FIG. 12 depicts an exemplary flowchart illustrating steps performed in calibrating resist side wall parameters to predict a width of a white-band according to one embodiment of the present disclosure.

FIG. 12 depicts an exemplary flowchart illustrating steps performed in calibrating resist side wall parameters to predict a width of a white-band according to one embodiment of the present disclosure. By one embodiment, the information obtained from the SEM waveform may be used to calibrate a 3D resist model. As described next, a predicted width of the white-band may be utilized to indicate resist features having a peculiar side wall shape. Thus, the process as outlined with reference to FIG. 12 can be used to indicate presence of hotspots, i.e., resist features that are expected to print in a poor fashion, i.e., the resist features that have an odd printing shape.

The process of FIG. 12 commences by obtaining parameters of a mask (step 1210), and an illumination optical system (step 1220) to generate a simulated aerial image (step 1230) of the resist layer.

Further, a set of calibrated resist parameters of a resist model (step 1240) and the generated aerial image in step 1230 are utilized to predict a resist contour of the resist structure in step 1250.

The process then moves to step 1260, wherein a width of a white-band is predicted based on the aerial image (step 1230), the predicted resist contour (1250), and initial values of resist side wall parameters (step 1280). By one embodiment, the resist side wall parameters include at least the VIR of the resist layer, line CD of the resist contour, and a slope of the aerial image.

Furthermore, by one aspect of the present disclosure, only one sidewall parameter may be used to generate the predicted width of the white-band. Alternatively, by one aspect any two sidewall parameters may be used to predict the width of white-band. Additionally, by one aspect, all three sidewall parameters (i.e., the VIR of the resist layer, line CD of the resist contour, and a slope of the aerial image) can be used to predict the width of white-band.

Upon predicting the width of the white-band, the process in FIG. 12 proceeds to step 1270, wherein a query is made to determine whether the predicted width of the white-band of step 1260 matches a measured white-band as obtained from a SEM device. Further, based on a degree of match between the predicted width of the white-band and the measured width of the white-band, the calibration process provides a feedback to step 1280. Specifically, the feedback loop corresponds to a step of parameter calibration, wherein the at least one resist sidewall parameter is updated in step 1280.

Further, the calibration process as outlined in FIG. 12 repeats the steps of 1260, 1270, and 1280 until a stopping criterion is satisfied. By one embodiment, the stopping criteria may correspond to having an exact match between predicted width of the white-band and the measured width of the white-band. Alternatively, by one embodiment, the stopping criterion may correspond to an error in the match between the predicted width of the white-band and the measured width of the white-band being within a predetermined threshold level. As described next, the calibration process of FIG. 12 can be utilized to indicate resist features that are expected to print on the substrate of the resist layer in unacceptable manner.

Figure 13:
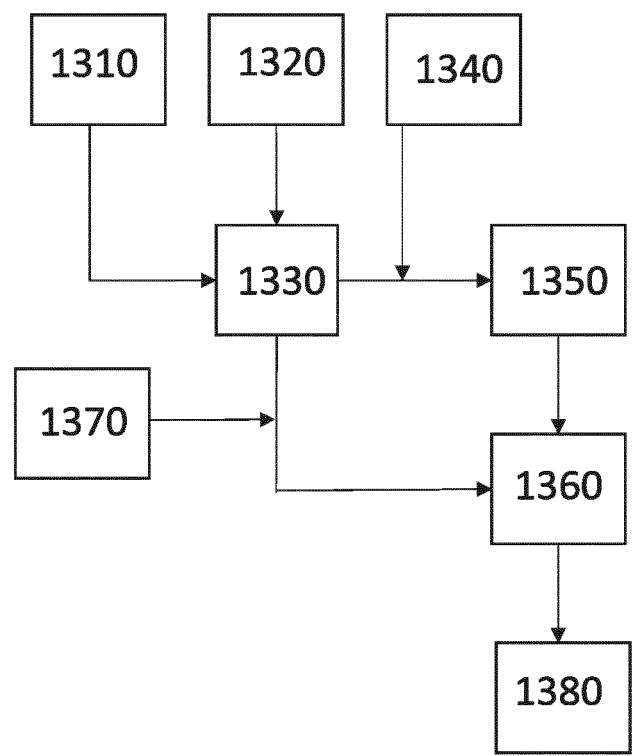
FIG. 13 depicts an exemplary flowchart illustrating steps performed to detect an odd feature of the resist layer.

FIG. 13 depicts an exemplary flowchart illustrating steps performed to detect an odd feature of the resist layer (i.e., a resist pattern that is expected to print on a substrate in an unacceptable fashion).

The process of FIG. 13 commences by obtaining parameters of a mask (step 1310), and an illumination optical system (step 1320) to generate a simulated aerial image (step 1330) of the resist layer.

Further, a set of calibrated resist parameters of a resist model (step 1340) and the generated aerial image in step 1330 are utilized to predict a resist contour of the resist structure in step 1350.

The process then moves to step 1360, wherein a width of a white-band corresponding to a particular resist feature under consideration is predicted based on the aerial image (step 1330), the predicted resist contour (1350), and calibrated values of resist side wall parameters (step 1370). By one embodiment, the resist side wall parameters include the VIR of the resist layer, line CD of the resist contour, and a slope of the aerial image, wherein at least one of the resist sidewall parameters is calibrated by the process as outlined in FIG. 12.

Based on the predicted width of the white-band in step 1360, odd resist printing features can be flagged in step 1380. Specifically, resist features that are expected print in a poor fashion are flagged based on the predicted white-band width of the resist feature. For instance, by one embodiment, based on the white-band being predicted to have a large value (i.e., a wide width white-band), the corresponding resist feature may be flagged as a feature that is expected to print in an unacceptable manner. It must be appreciated that the information corresponding to the predicted width of the white-band may be utilized in improving efficiency of etching models. What is considered too wide will vary depending on the specific pattern being considered. It may, for example, depend on the resist type or the typical line width for the pattern. In the particular case considered here, a white band wider than 18 nm could be considered to be too wide. Broadly, a given process can include selected threshold values defining outer limits for acceptable feature sizes.

Figure 14:
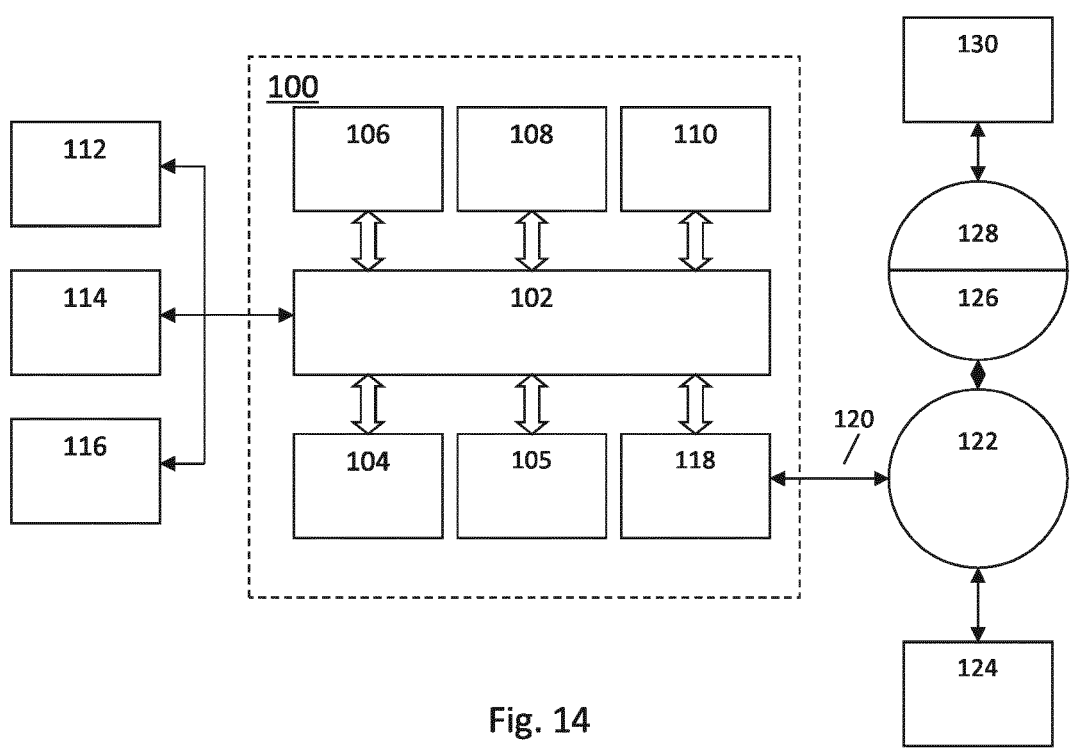
FIG. 14 is a block diagram of an example computer system.

FIG. 14 is a block diagram that illustrates a computer system 100 which perform one or more aspects of the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random-access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for a process as described herein, for example. The received code may be executed by processor 104 as it is received, and/or stored in storage device 110, or other non-volatile storage for later execution. In this manner, computer system 100 may obtain application code in the form of a carrier wave.

Figure 15:
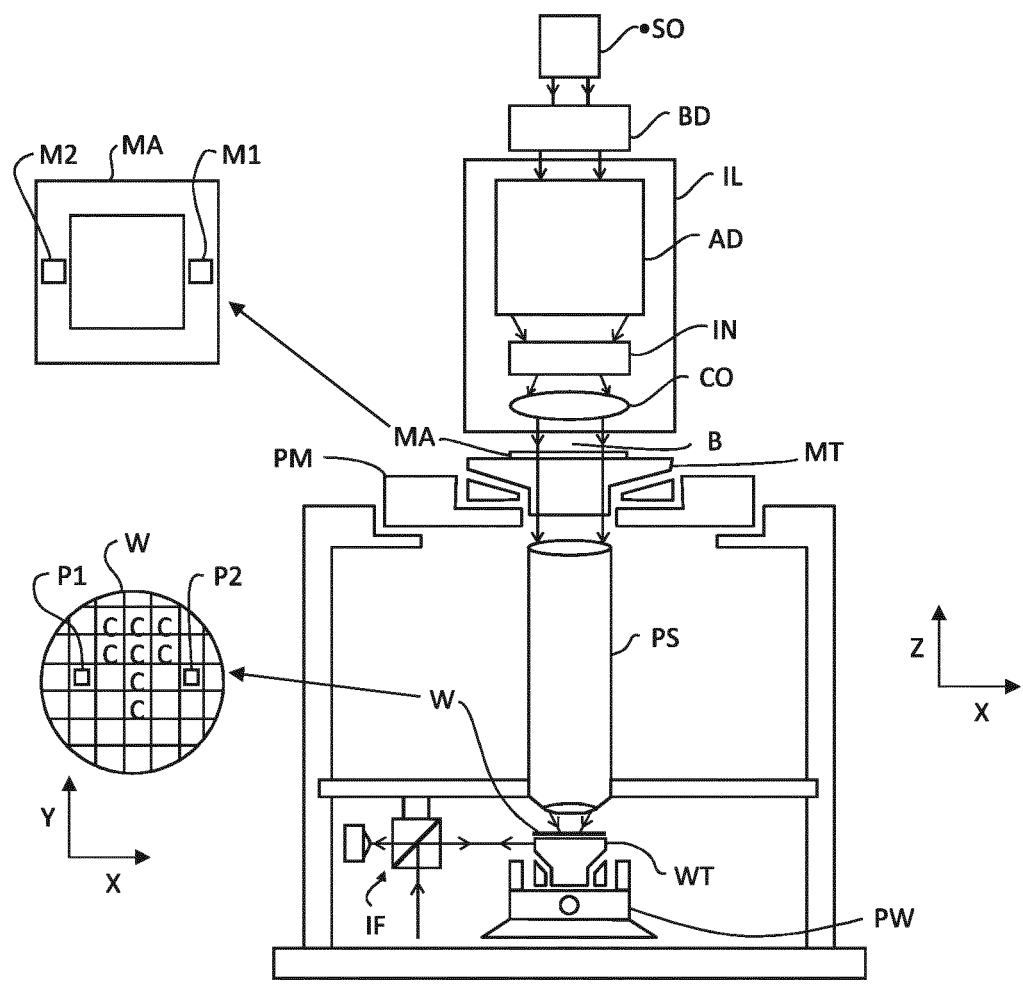
FIG. 15 is a schematic diagram of a lithography projection apparatus.

FIG. 15 schematically depicts an exemplary lithographic projection apparatus for use with the methods described herein. The apparatus comprises:

- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 16:
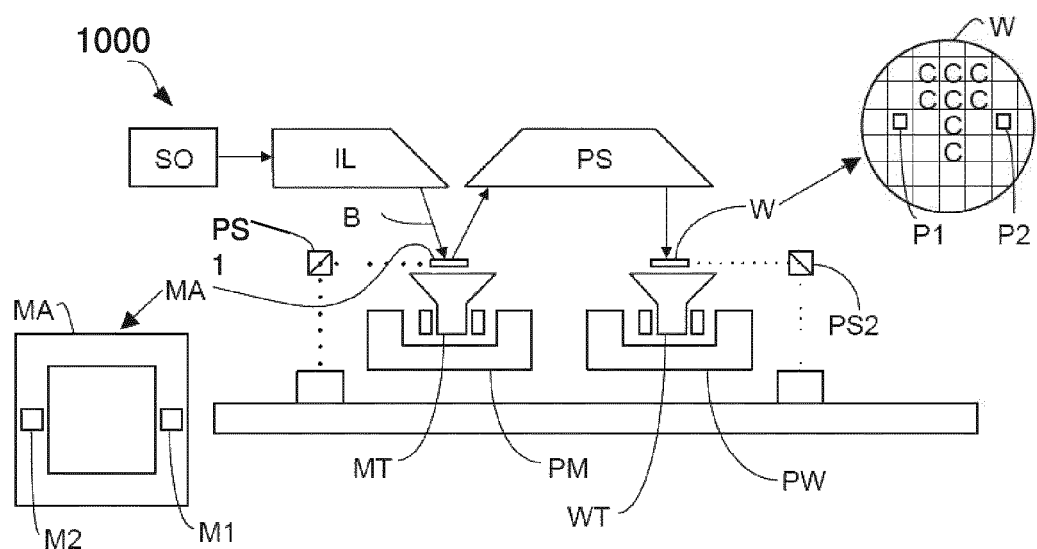
FIG. 16 is a schematic diagram of another lithography projection apparatus.

FIG. 16 schematically depicts another exemplary lithographic projection apparatus 1000 that can be used for the methods described herein.

The lithographic projection apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to mask less lithography that utilizes programmable patterning device, such as a programmable mirror array of a type as referred to above.

Figure 17:
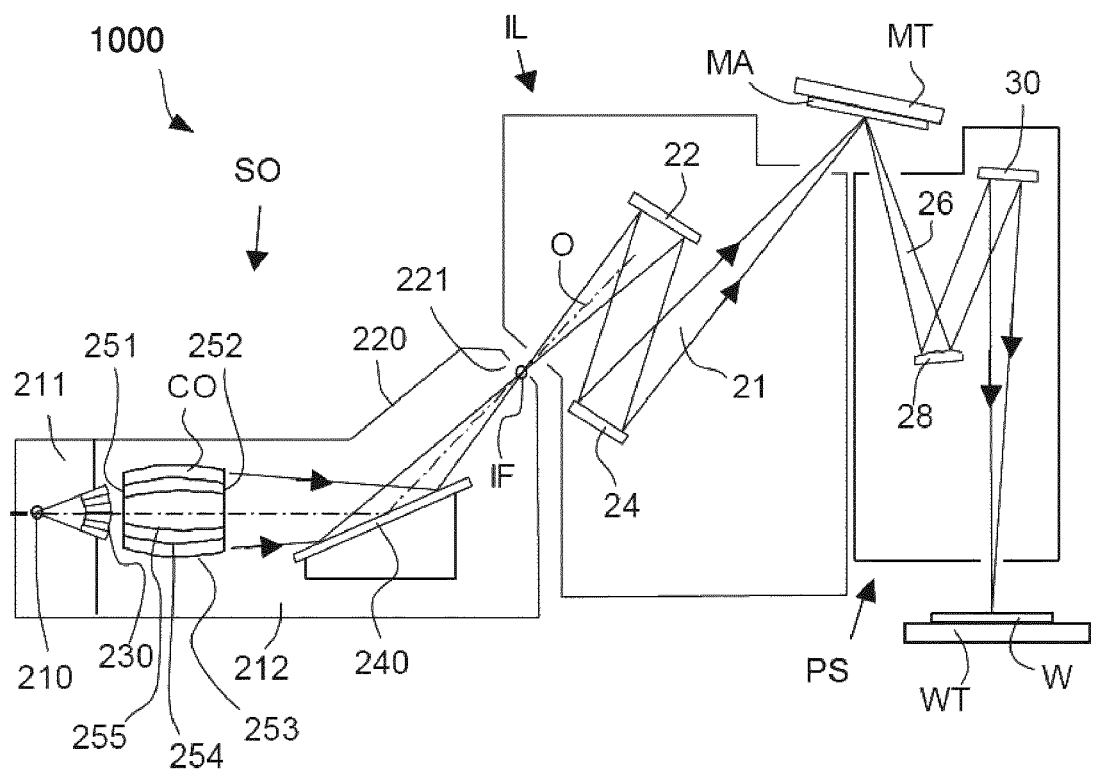
FIG. 17 is a more detailed view of the apparatus of FIG. 16.

FIG. 17 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. A EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 18:
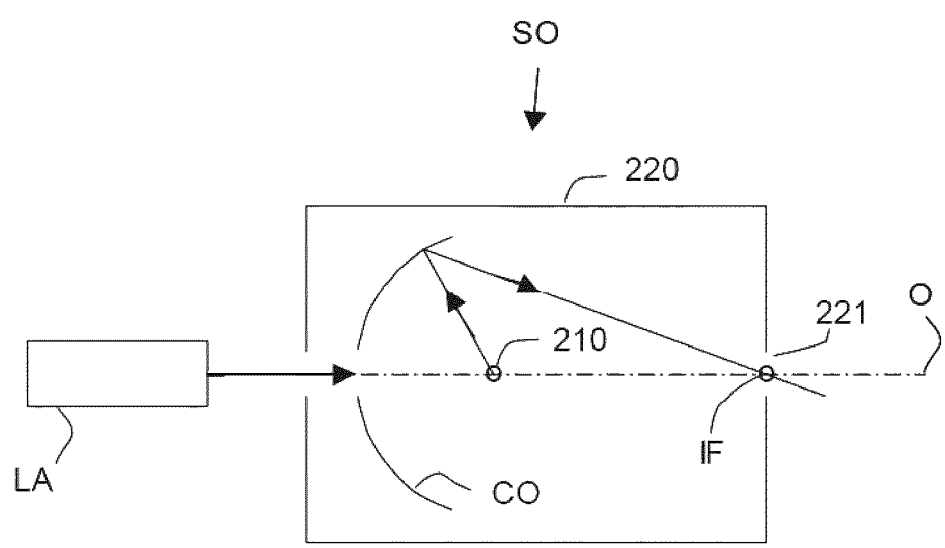
FIG. 18 is a more detailed view of the source collector module of the apparatus of FIG. 16 and FIG. 17.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Although specific reference may be made in this text to the manufacture of devices such as ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The embodiments may further be described using the following clauses:

1. A method of calibrating a resist model, the method comprising:
generating a modeled resist contour of a resist structure based on a simulated aerial image of the resist structure and parameters of the resist model;
predicting a metrology contour of the resist structure from the modeled resist contour based on information of an actual resist structure obtained by a metrology device; and
adjusting the parameters of the resist model based on a comparison of the predicted metrology contour and an actual metrology contour of the actual resist structure obtained by the metrology device.

2. The method of clause 1, wherein the information of the actual resist structure obtained by the metrology device corresponds to a width of a portion of a waveform generated by the metrology device.

3. The method of clause 2, wherein the portion of the waveform corresponds to an edge of the actual resist structure imaged by the metrology device.

4. The method according to any of clauses 1 to 3, wherein the width of the portion of the waveform is measured at a predetermined threshold intensity level.

5. The method according to any of clauses 1 to 4, wherein the predicted metrology contour of the resist structure is generated from the modeled resist contour based on parameters associated with the metrology device.

6. The method according to anyone of clauses 1 to 5, further comprising:
updating parameters of the metrology device based on a comparison of the predicted metrology contour and the actual metrology contour of the actual resist structure obtained by the metrology device.

7. The method according to anyone of clauses 1 to 6, wherein the metrology device is a scanning electron microscope.

8. The method of clause 1, further comprising:
optimizing parameters of a mask layout and parameters of an optical source based on adjusted resist parameters of the resist model.

9. The method of clause 1, further comprising:
predicting, based on the adjusted parameters of the resist model, a metrology contour of another resist structure;
obtaining by the metrology device, an actual metrology contour of the another resist structure; and
computing an error based on a comparison of the predicted metrology contour of another resist structure and the actual metrology contour of another resist structure.

10. A device for calibrating a resist model, the device comprising:
a processor configured to
generate a modeled resist contour of a resist structure based on a simulated aerial image of the resist structure and parameters of the resist model;
predict a metrology contour of the resist structure from the modeled resist contour based on information of an actual resist structure obtained by a metrology device; and
adjust the parameters of the resist model based on a comparison of the predicted metrology contour and an actual metrology contour of the actual resist structure obtained by the metrology device.

11. The device of clause 10, wherein the information of the actual resist structure obtained by the metrology device corresponds to a width of a portion of a waveform generated by the metrology device.

12. The device according to clause 11, wherein the portion of the waveform corresponds to an edge of the actual resist structure imaged by the metrology device.

13. The device according to anyone of clauses 10 to 12, wherein the width of the portion of the waveform is measured at a predetermined threshold intensity level.

14. The device according to any of clauses 10 to 13, wherein the predicted metrology contour of the resist structure is generated from the modeled resist contour based on parameters associated with the metrology device.

15. The device according to anyone of clauses 10 to 14, wherein the processor is further configured to:
update parameters of the metrology device based on a comparison of the predicted metrology contour and the actual metrology contour of the actual resist structure.

16. The device according to anyone of clauses 10 to 16, wherein the metrology device is a scanning electron microscope.

17. The device according to clause 10, wherein the processor is further configured to:

optimize parameters of a mask layout and parameters of an optical source based on adjusted resist parameters of the resist model.

18. The device according to clause 10, wherein the processor is further configured to:

predict based on the adjusted parameters of the resist model, a metrology contour of another resist structure;

obtain by the metrology device, an actual metrology contour of the another resist structure; and compute an error based on a comparison of the predicted metrology contour of another resist structure and the actual metrology contour of another resist structure.

19. A non-transitory computer program product comprising machine-readable instructions for causing a processor to cause performance of the method of any of clauses 1 to 9.

20. A system, comprising
a hardware processor; and
the non-transitory computer program product of clause 19.

21. A method comprising:

generating a modeled resist contour of a resist structure based at least on a simulated aerial image of the resist structure;

predicting, based on the modeled resist contour, the simulated aerial image, and at least one resist sidewall parameter of a set of resist sidewall parameters associated with the resist structure, a measurement of a portion of a waveform corresponding to an edge of an actual resist structure imaged by a metrology device; and adjusting the at least one resist sidewall parameter based on a comparison of the predicted measurement of the portion of the waveform and an actual measurement of the portion of the waveform corresponding to the edge of the actual resist structure imaged by the metrology device.

22. The method according to clause 21, wherein the predicted measurement of the portion of a waveform is a width of the portion of a waveform generated by the metrology device, the width being measured at a predetermined threshold intensity level.

23. The method of clause 21, wherein the predicted measurement of the portion of the waveform generated by the metrology device is based on at least two resist sidewall parameters of the set of resist sidewall parameters.

24. The method of clause 21, wherein the set of resist sidewall parameters includes three resist sidewall parameters, and the predicted measurement of the portion of the waveform generated by a metrology device is based on each resist sidewall parameter of the set of resist sidewall parameters.

25. The method of according to clauses 21 to 24, wherein the set of resist sidewall parameters includes a vertical intensity range parameter, a critical distance linewidth parameter, and a slope of the aerial image parameter.

26. The method according to clause 25, wherein the vertical intensity range parameter is computed as a difference between a first intensity of a first aerial image and a second intensity of a second aerial image, the first aerial image corresponding to a first location within a resist layer and the second aerial image corresponding to a second location within the resist layer.

27. The method according to clause 25, wherein the first location is in a top-third portion of the resist layer and the second location is in a bottom-third portion of the resist layer.

28. The method according to anyone of clauses 26 to 27, wherein the first location is 15 nanometers below a top surface of the resist layer and the second location is 75 nanometers below the top surface of the resist layer.

29. The method of clause 21, further comprising:
optimizing parameters of a mask layout and parameters of an optical source based on the adjusted resist sidewall parameters.

30. The method of clause 21, further comprising:
predicting, based on a modeled resist contour of another resist structure, a simulated aerial image of another resist structure, and the adjusted at least one resist sidewall parameter of the set of resist sidewall parameters, another measurement of a portion of another waveform corresponding to an edge of another actual resist structure imaged by the metrology device; and determining an etch-quality of the edge of another actual resist structure based on the predicted measurement of the portion of another waveform.

31. A non-transitory computer program product comprising machine-readable instructions for causing a processor to cause performance of the method of any of clauses 21 to 30.

32. A system, comprising
a hardware processor; and
the non-transitory computer program product of clause 31.

33. A method as in any of clauses 1 to 9 wherein the predicted metrology contour and the actual metrology contour are parameterized, and the parameterizations of the contours are used in the comparison.

34. A device as in any of clauses 10 to 18 wherein the predicted metrology contour and the actual metrology contour are parameterized, and the parameterizations of the contours are used in the comparison.

It is noted that the terms "mask", "reticle", and "patterning device" are utilized interchangeably herein. Also, a person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet radiation (EUV), e.g. having a wavelength in the range 5-20 nm).

The terms "optimizing" and "optimization" as used herein mean adjusting a lithographic projection apparatus and/or a patterning process such that results and/or processes of the patterning process (such as lithography) have a more desirable characteristic, such as higher accuracy of projection of design layouts on a substrate, a larger process window, etc. The terms "optimizing" and "optimization" do not necessarily require that results and/or processes of lithography have the most desirable characteristics, such as highest accuracy of projection of design layouts on a substrate, largest process window, etc.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and/or a programmable LCD array.

The concepts disclosed herein may simulate or mathematically model any patterning process, and may be especially useful with imaging technologies capable of producing increasingly shorter wavelengths. Examples of such imaging technologies already in use include EUV (extreme ultra violet), DUV lithography that is capable of producing a 193 nm wavelength with the use of an ArF laser and/or a 157 nm wavelength with the use of a fluorine laser. Moreover, EUV lithography is capable of producing wavelengths within a range of about 5 nm to about 20 nm by using, e.g., a synchrotron or by hitting a material (either solid or a plasma) with high energy electrons in order to produce photons within this range.

While the concepts disclosed herein may be used for patterning processes involving imaging on a substrate such as a silicon wafer, it shall be understood that the disclosed concepts may be used with any type of lithographic systems, e.g., those used for imaging on substrates other than silicon wafers.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method of calibrating a resist model, the method comprising:
    generating a modeled resist contour of a resist structure based on a simulated aerial image of the resist structure and one or more parameters of the resist model;
    predicting a metrology contour of the resist structure from the modeled resist contour and information of an actual resist structure obtained by a metrology device, wherein the predicted metrology contour is a function of one or more values of the modeled resist contour and of one or more values of the information ; and
    adjusting one or more parameters of the resist model based on a comparison between the predicted metrology contour and an actual metrology contour of the actual resist structure obtained by the metrology device.

2. The method of claim 1, wherein the information of the actual resist structure obtained by the metrology device corresponds to a width of a portion of a waveform generated by the metrology device.

3. The method of claim 2, wherein the portion of the waveform corresponds to an edge of the actual resist structure imaged by the metrology device.

4. The method of claim 2, wherein the width of the portion of the waveform is measured at a predetermined threshold intensity level.

5. The method of claim 1, wherein the predicted metrology contour of the resist structure is generated from the modeled resist contour based on one or more parameters associated with the metrology device.

6. The method of claim 1, further comprising updating one or more parameters of the metrology device based on a comparison of the predicted metrology contour and the actual metrology contour of the actual resist structure obtained by the metrology device.

7. The method of claim 1, wherein the metrology device is a scanning electron microscope.

8. The method of claim 1, further comprising optimizing one or more parameters of a mask layout and/or one or more parameters of an optical illumination, based on the one or more adjusted parameters of the resist model.

9. The method of claim 1, further comprising:
    predicting, based on the one or more adjusted parameters of the resist model, a metrology contour of another resist structure;
    obtaining, by the metrology device, an actual metrology contour of the another resist structure; and
    computing an error based on a comparison of the predicted metrology contour of the another resist structure and the actual metrology contour of the another resist structure.

10. The method of claim 1, wherein the predicted metrology contour and the actual metrology contour are parameterized, and the parameterizations of the contours are used in the comparison.

11. A device for calibrating a resist model, the device comprising:
    a processor configured to at least:
        generate a modeled resist contour of a resist structure based on a simulated aerial image of the resist structure and one or more parameters of the resist model;
        predict a metrology contour of the resist structure from the modeled resist contour and information of an actual resist structure obtained by a metrology device, wherein the predicted metrology contour is a function of one or more values of the modeled resist contour and of one or more values of the information ; and
        adjust one or more parameters of the resist model based on a comparison between the predicted metrology contour and an actual metrology contour of the actual resist structure obtained by the metrology device.

12. The device of claim 11, wherein the information of the actual resist structure obtained by the metrology device corresponds to a width of a portion of a waveform generated by the metrology device.

13. The device of claim 12, wherein the portion of the waveform corresponds to an edge of the actual resist structure imaged by the metrology device.

14. The device of claim 12, wherein the width of the portion of the waveform is measured at a predetermined threshold intensity level.

15. The device of claim 11, wherein the predicted metrology contour and the actual metrology contour are parameterized, and the parameterizations of the contours are used in the comparison.

16. A computer program product comprising a non-transitory computer readable medium having instructions therein, the instructions, upon execution by a computer system, configured to cause the computer system to at least:
generate a modeled resist contour of a resist structure based on a simulated aerial image of the resist structure and one or more parameters of the resist model;
predict a metrology contour of the resist structure from the modeled resist contour and information of an actual resist structure obtained by a metrology device, wherein the predicted metrology contour is a function of one or more values of the modeled resist contour and of one or more values of the information ; and
adjust one or more parameters of the resist model based on a comparison between the predicted metrology contour and an actual metrology contour of the actual resist structure obtained by the metrology device.

17. A method comprising:
generating a modeled resist contour of a resist structure based at least on a simulated aerial image of the resist structure;
predicting, based on the modeled resist contour, the simulated aerial image, and at least one resist sidewall parameter of a set of resist sidewall parameters associated with the resist structure, a measurement of a portion of a waveform corresponding to an edge of an actual resist structure imaged by a metrology device; and
adjusting the at least one resist sidewall parameter based on a comparison between the predicted measurement of the portion of the waveform and an actual measurement of the portion of the waveform corresponding to the edge of the actual resist structure imaged by the metrology device.

18. The method of claim 17, wherein the predicted measurement of the portion of the waveform is a width of the portion of the waveform generated by the metrology device, the width being measured at a predetermined threshold intensity level.

19. The method of claim 17, wherein the predicted measurement of the portion of the waveform generated by the metrology device is based on at least two resist sidewall parameters.

20. A computer program product comprising a non-transitory computer readable medium having instructions therein, the instructions, upon execution by a computer system, configured to cause the computer system to at least:
generate a modeled resist contour of a resist structure based at least on a simulated aerial image of the resist structure;
predict, based on the modeled resist contour, the simulated aerial image, and at least one resist sidewall parameter of a set of resist sidewall parameters associated with the resist structure, a measurement of a portion of a waveform corresponding to an edge of an actual resist structure imaged by a metrology device; and
adjust the at least one resist sidewall parameter based on a comparison between the predicted measurement of the portion of the waveform and an actual measurement of the portion of the waveform corresponding to the edge of the actual resist structure imaged by the metrology device.

* * * * *